(12) United States Patent
McDaniel et al.

(10) Patent No.: US 9,470,396 B2
(45) Date of Patent: Oct. 18, 2016

(54) DIRECTIVE OPTICAL DEVICE HAVING A PARTIALLY REFLECTIVE GRATING

(75) Inventors: Steven F. McDaniel, Salt Lake City, UT (US); Steven M. Blair, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 709 days.

(21) Appl. No.: 13/696,009

(22) PCT Filed: May 4, 2011

(86) PCT No.: PCT/US2011/035235
§ 371 (c)(1),
(2), (4) Date: Mar. 15, 2013

(87) PCT Pub. No.: WO2011/140252
PCT Pub. Date: Nov. 10, 2011

(65) Prior Publication Data
US 2013/0170219 A1    Jul. 4, 2013

Related U.S. Application Data

(60) Provisional application No. 61/343,878, filed on May 5, 2010.

(51) Int. Cl.
| | |
|---|---|
| F21V 7/00 | (2006.01) |
| H01L 31/0232 | (2014.01) |
| H01L 31/0216 | (2014.01) |
| H01L 31/18 | (2006.01) |
| G02B 17/00 | (2006.01) |

(52) U.S. Cl.
CPC ........... *F21V 7/00* (2013.01); *H01L 31/02165* (2013.01); *H01L 31/02168* (2013.01); *H01L 31/02327* (2013.01); *H01L 31/1868* (2013.01); *G02B 17/004* (2013.01); *H01L 2933/0091* (2013.01); *Y02E 10/50* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 2003/0183892 A1 | 10/2003 | Morse | |
| 2005/0087884 A1* | 4/2005 | Stokes | H01L 33/405 257/778 |
| 2005/0199888 A1* | 9/2005 | Seong | H01L 33/387 257/79 |
| 2006/0279190 A1* | 12/2006 | Nakayama | 313/113 |
| 2007/0272933 A1* | 11/2007 | Kim et al. | 257/94 |
| 2008/0013575 A1 | 1/2008 | Imai | |

(Continued)

FOREIGN PATENT DOCUMENTS

| | | |
|---|---|---|
| EP | 0620475 A1 | 10/1994 |
| EP | 0375426 B1 | 3/1996 |
| EP | 2138882 A2 | 12/2009 |

OTHER PUBLICATIONS

International Search Report issued for PCT/US2011/140252, dated Dec. 9, 2011, 4 pages.

(Continued)

*Primary Examiner* — Khaja Ahmad
(74) *Attorney, Agent, or Firm* — Michael Best & Friedrich LLP (57) ABSTRACT

A directive optical device includes an optically active material which may be a light emitting material or a light collecting material. A partially reflective grating is disposed proximate to the optically active material.

31 Claims, 3 Drawing Sheets

(56) References Cited

U.S. PATENT DOCUMENTS

2009/0021153 A1* 1/2009 Lee et al. .................. 313/504
2010/0096622 A1* 4/2010 Iizumi et al. ................ 257/40
2010/0178756 A1* 7/2010 Takizawa et al. ........... 438/493

OTHER PUBLICATIONS

Written Opinion issued for PCT/US2011/140252, dated Aug. 30, 2012, 6 pages.
B. Wang et al., "A Nano-patterned Organic Light-Emitting Diode with High Extraction Efficiency," Journal of Crystal Growth, vol. 288, Jan. 2006, pp. 119-122, Elsevier B.V.
Trieu, S. S. et al., "Study of Top and Bottom Photonic Gratings on GaN LED With Error Grating Models," IEEE Journal of Quantum Electronics, vol. 46, No. 10, pp. 1456-1463, Oct. 2010, IEEE.
Guglielmi, M. et al., "Multimode Network Description of a Planar Periodic Metal-Strip Grating at a Dielectric Interface—Part III: Rigorous Solution," IEEE Transactions on Microwave Theory and Techniques, vol. 37, No. 5, pp. 902-909, May 1989, IEEE.
Chen, C. et al., "Polarized Light-emitting Diode with Its InGaN/GaN Quantum Well Coupled with Surface Plasmons on a Metal Grating," 2009 Conference on Quantum Electronics and Laser Science, Jun. 2-4, 2009, 2 pages.
Das, N.C., "Effect of Grating on IR LED Device Performance," Infrared Physics and Technology, vol. 53, pp. 71-75, 2010, Elsevier.

* cited by examiner

DIRECTIVE OPTICAL DEVICE HAVING A PARTIALLY REFLECTIVE GRATING

CROSS-REFERENCE TO RELATED APPLICATIONS

The present application is a U.S. National State of International Application No. PCT/US2011/035235, filed May 4, 2011, designating the United States and claiming priority to U.S. Provisional Patent Application No. 61/343,878, filed May 5, 2010, the disclosures of which are incorporated herein by reference in their entirety.

FIELD

The present application relates to devices for directive emission or collection of light.

BACKGROUND

Light emitting devices, such as light emitting diodes, are finding use in a variety of applications. One concern with such devices has been the efficiency of these devices. For example, incomplete light extraction from the active (light-emitting) layers in the devices may be caused by many factors, including internal reflection, coupling into waveguide modes, and dissipation in internal layers. In particular, total internal reflection at layer interfaces, dielectric waveguide modes within high index layers, and dissipation into metal contacts may cause losses. Similar problems may affect light collecting devices, such as photo diodes.

SUMMARY

In some embodiments, a directive optical device is provided. The device may include an optically active material having a first side and a second side and being capable of converting between an electrical voltage and light at a wavelength. A first electrical contact may be in electrical communication with the optically active material proximate to the first side. The first electrical contact may be reflective at the wavelength. A second electrical contact may be in electrical communication with the optically active material proximate to the second side. The second electrical contact may be transparent at the wavelength. A partially reflective grating may be disposed proximate to the second electrical contact. The partially reflective grating can include a periodic array of alternating optically reflective and non-reflective regions.

In some embodiments, a directive optical device may include a means for converting between electromagnetic radiation and an electrical voltage. The electromagnetic radiation may include a wavelength. The device may include a means for reflecting the electromagnetic radiation disposed proximate to a first side of the means for converting. The device may also include a means for inhibiting lateral propagation and partially reflecting electromagnetic radiation disposed proximate to a second side of the means for converting.

In some embodiments, a method for operating a directive optical device is provided. The method may include providing an optically active material having electrical contacts in electrical communication therewith. The method may also include converting between electromagnetic radiation and an electrical voltage across the electrical contacts using the optically active material, wherein the electromagnetic radiation has a wavelength. Additional operations in the method may be reflecting electromagnetic radiation proximate to a first side of the optically active material and partially reflecting electromagnetic radiation proximate to a second side of the optically active material. The method may include inhibiting lateral propagation of the electromagnetic radiation within the optically active material.

BRIEF DESCRIPTION OF THE DRAWINGS

Additional features and advantages of the invention will be apparent from the detailed description that follows, taken in conjunction with the accompanying drawings, that together illustrate, by way of example, features of the invention; and, wherein.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In describing the present invention, the following terminology will be used:

The singular forms "a," "an," and "the" include plural referents unless the context clearly dictates otherwise. Thus, for example, reference to an item includes reference to one or more of the items.

As used herein, the term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art.

By the term "substantially" is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. In particular, by "substantially transparent" is meant that a material allows a desired amount (e.g., more than half) of a specified electromagnetic frequency or wavelength range to pass through. Similarly, by "substantially reflective" is meant that a material reflects a desired amount (e.g., more than half) of a specified electromagnetic frequency or wavelength range to be reflected.

Numerical data may be expressed or presented herein in a range format. It is to be understood that such a range format is used merely for convenience and brevity and thus should be interpreted flexibly to include not only the numerical values explicitly recited as the limits of the range, but also interpreted to include all the individual numerical values or sub-ranges encompassed within that range as if each numerical value and sub-range is explicitly recited. As an illustration, a numerical range of "about 1 to 5" should be interpreted to include not only the explicitly recited values of about 1 to 5, but also include individual values and sub-ranges within the indicated range. Thus, included in this numerical range are individual values such as 2, 3, and 4 and sub-ranges such as 1-3, 2-4, and 3-5, etc. This same principle applies to ranges reciting only one numerical value and should apply regardless of the breadth of the range or the characteristics being described.

As used herein, a plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items.

As used herein, the term "alternatively" refers to selection of one of two or more alternatives, and is not intended to limit the selection to only those listed alternatives or to limit the selection to only a single alternative at a time unless the context clearly indicates otherwise.

Figure 1:
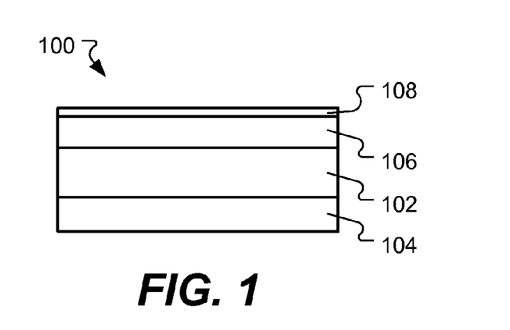
FIG. 1 is a side view illustration of a directive optical device in accordance with some embodiments of the present invention.

Turning to FIG. 1, a directive optical device is illustrated in side view in accordance with some embodiments of the present invention. The device, shown generally at 100, may provide for improved efficiency in emitting or collecting light. For example, the light may include electromagnetic energy at one or more wavelengths within the infrared, optical, and ultraviolet bands and any combination thereof. The device may include an optically active material 102. Electrical contacts may be disposed proximate to the optically active material, and may include a first electrical contact 104 and a second electrical contact 106. The first electrical contact may be in electrical communication with a first side of the optically active material and the second electrical contact may be in electrical communication with a second side of the optically active material. In some embodiments, the optically active material may be disposed between the first electrical contact and the second electrical contact.

In some embodiments, the optically active material 102 may be a light emitting material (e.g., an electroluminescent material, a light emitting diode, an organic light emitting diode, a lazing material, a filament, and a thermal emitter). In some embodiments, the optically active material may consist essentially of one or more organic materials. In some embodiments, the optically active material may include a number of layers. For example, the optically active material may include a conductive layer and an emissive layer (e.g., TPD and Alq3). As another example, the optically active material may include an n-type material and a p-type material to form a PN junction. The optically active material may be capable of emission of electromagnetic radiation at one or more operating wavelengths. The electrical contacts 104, 106 may be used to apply a voltage (or current) to the optically active material to cause electromagnetic emission from the optically active material.

When the optically active material 102 is a light emitting material, emission from the device 100 may be in a generally upward direction relative to FIG. 1, although it will be appreciated that the device may be oriented in any desired direction. In some embodiments, the first electrical contact 104 may be reflective at the operating wavelength, causing emission from the optically active material 102 that exits in a downward direction to be reflected back upward from the first electrical contact. The first electrical contact may reflect substantially all of the emission emitted in a downward direction from the optically active material back in an upward direction. For example, in various embodiments, the first electrical contact may reflect more than 80%, 90%, 95%, or 99% of the emission that is incident on the first electrical contact. In some embodiments, the first electrical contact may consist essentially of aluminum, may include aluminum, or may include alloys of aluminum.

The second electrical contact 106 may be transparent at the operating wavelength, allowing emission travelling upward to pass through the second electrical contact. For example, emission from the optically active material 102 traveling in an upward direction, and emission which has been reflected back in an upward direction from the second electrical contact 104 may pass through the second electrical contact. The second electrical contact may allow substantially all of the emission travelling in an upward direction to pass through. For example, in various embodiments, the second electrical contact may allow 80%, 90%, 95%, or 99% of the emission to pass through. In some embodiments, the second electrical contact may consist essentially of indium-tin-oxide, may include indium-tin-oxide, or may include alloys and oxides of indium and tin.

The electrical contacts 104, 106 may include an electrically conductive material. In some embodiments, the electrical contacts may include multiple layers of material (e.g., a metallic conductor and a hole or electron transport layer). The electrical contacts may be designed to provide an Ohmic connection to an electrical circuit at one side while providing efficient injection of holes or electrons at the other side adjacent to the optically active material 102.

The device 100 may also include a partially reflective grating 108. Although the partially reflective grating is shown here adjacent to the second electrical contact 106, in various embodiments the partially reflective grating may be positioned within the second electrical contact, adjacent to the optically active material 102, or spaced away from the optically active material. In some embodiments, the partially reflective grating may create an asymmetric Fabry-Perot resonator, which may help to improve the emission/collection efficiency as discussed further below.

In some embodiments, the partially reflective grating 108 may include a periodic array of alternating optically reflective and optically non-reflective (transmissive) regions. For example, the optically reflective regions may be a plurality of conductive patches may be disposed in array. As another example, a plurality of non-conductive apertures may be disposed within a conductive sheet. The optically reflective and optically non-reflective regions may extend in one or more directions perpendicular to a desired operation direction (e.g., direction in which light may be emitted to or collected from). For example, the optically reflective and optically non-reflective regions may be disposed within a plane that is parallel to the optically active material 102.

Figure 2:
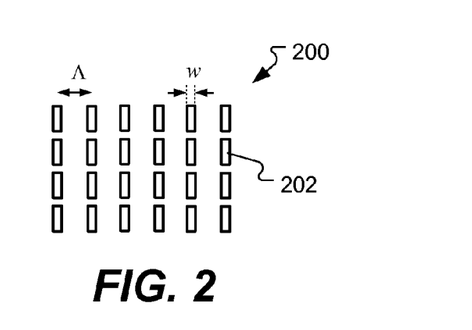
FIG. 2 is a top view illustration of a partially reflective grating which may be used in the device of FIG. 1 in accordance with some embodiments of the present invention.

For example, FIG. 2 illustrates a top view of a partially reflective grating in the form of a patch grating in accordance with some embodiments of the present invention, which may be used as the partially reflective grating 108 of FIG. 1. The patch grating, shown generally at 200, may include a periodic array of electrically conductive patches 202 spaced from each other by about one half of the wavelength at the operating frequency. For example, the spacing (pitch) $\Lambda$, may be an optical distance substantially equal to $\lambda/2$, wherein $\lambda$ is the wavelength (within the device) at the operating frequency. It will be appreciated that optical distance, measured in terms of wavelengths, corresponds to differing physical distances depending upon characteristics of the material in which the electromagnetic energy is propagating. In particular, the wavelength of electromagnetic radiation within a material is generally shorter than the wavelength in free space. The refractive index of the material determines the relationship of the wavelength of electromagnetic radiation within the material compared to the wavelength in free space.

The patches 202 may have various shapes. In some embodiments, the patches may have a one-dimensional structure, extending much greater than one wavelength in one direction and extending less than or equal to one half wavelength in another direction. In some embodiments, the patches may have a two-dimensional structure, extending in two directions. For example, the patches may be rectangular. As another example, the patches may be square, having an optical width w equal to about $\lambda/3$. As a specific example, a device designed to operate at a free space wavelength of about 500 nanometer (nm) may use materials having a refractive index of about 2 (resulting in a wavelength of about 250 nm within the device). The device may include patches spaced by about 125 nm, wherein the patches have a width of about 80 nm.

Without wishing to be bound by any particular theory, operation of a directive optical device 100 (FIG. 1) in an emission mode will now be explained as best understood with reference to a partially reflective grating 200 (FIG. 2). The reflective first electrical contact 104 and the partially reflective grating 108 together may form an asymmetric Fabry-Perot resonator. The reflective first electrical contact may create an image of the emitters in the optically active material 102. The patches (e.g., 202) within the partially reflective grating 108 may create additional images, providing further directivity. Furthermore, patches spaced with a pitch of about a half wavelength may inhibit lateral propagation of radiative energy, further enhancing the directivity and efficiency. In particular, for patches spaced half a wavelength apart, scattering from the patches tends to cancel. The may effectively create a cavity in which the optically active material is disposed. Depending on the relative spacing between the electrical contacts, optically active material, and partially reflective grating, differing directivity may be obtained as will be explained further below. For example, the patch pitch used may be selected to impose a desired angular distribution for light emitted in different dimensions. In some embodiments, patches may have a pitch close to one-half wavelength in a first direction to provide tightly focused angular control of light emission in one dimension, while patches may have a pitch considerably different than one-half wavelength in a second direction (orthogonal to the first direction) to allow broader angular distribution of light emission in a second dimension. In general, the patch width, path length, and patch spacing (in each of two directions) may be varied to achieve a desired angular profile for emitted light. For example, in various embodiments, the patch spacing (pitch) may be less than a half wavelength, less than or equal to a half wavelength, greater than or equal to a half wavelength, or greater than a half wavelength.

In some embodiments, the optically active material 102 may be a light collecting material (e.g., a photoactive layer, a sensor, a photovoltaic device, a thermoelectric device, and a thermal target). Electromagnetic radiation incident on the optically active material may induce a voltage across (or current through) the electrical contacts 104, 106.

When the optically active material 102 is a light collecting material, the device 100 may collect radiation incident on the device from above relative to FIG. 1, although it will be appreciated that the device may be oriented in any desired direction. Thus, light incident on the device may pass through the partially reflective grating 108 and second electrical contact 106 into the optically active material. Any light passing through the optically active material may be reflected back upward by the first electrical contact 104. Similarly, light travelling upward may be partially reflected back down toward the optically active material by the partially reflective grating. In some embodiments, the first electrical contact may reflect substantially all of the light passing downward and through the optically active material to be reflected back in an upward direction. For example, in various embodiments, the first electrical contact may reflect more than 80%, 90%, 95%, or 99% of the light that is incident on the first electrical contact. In some embodiments, the second electrical contact may allow substantially all of the light travelling in a downward direction to pass through. For example, in various embodiments, the second electrical contact may allow 80%, 90%, 95%, or 99% of the light to pass through.

Without wishing to be bound by any particular theory, operation of a directive optical device 100 in a collection mode will now be explained as best understood. Similarly to operation in an emission mode, the reflective first electrical contact 104 and the (partially reflective) partially reflective grating 108 together may form an asymmetric Fabry-Perot resonator in a similar manner as described above, providing reciprocal directivity to the emission mode. Moreover, the resulting cavity may enhance the efficiency of coupling between the incoming electromagnetic wave and the optically active material disposed within the cavity. Patch dimensions and spacing between the electrical contacts, optically active material, and partially reflective grating may be selected in a similar manner as in the emission mode to provide desired directivity.

Figure 3A:
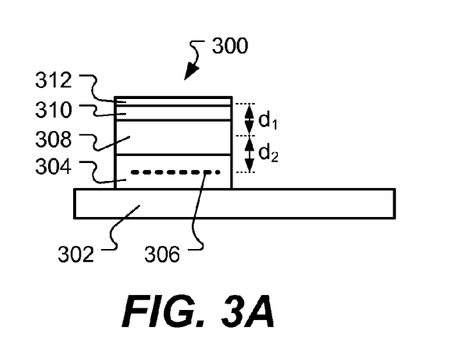
FIG. 3A is a side view illustration of another directive optical device in accordance with some embodiments of the present invention.
Figure 3B:
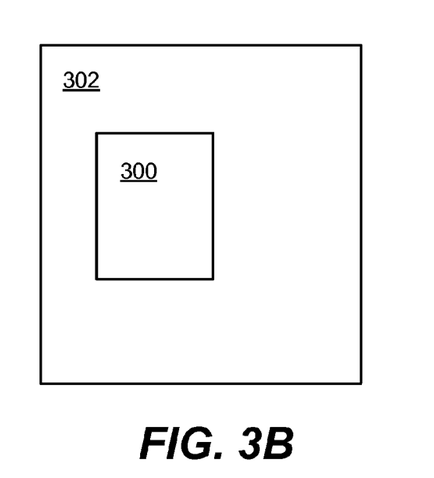
FIG. 3B is a top view illustration of the device of FIG. 3A.

In some embodiments, a directive optical device may be disposed on a substrate, for example, as shown in side view in FIG. 3A and top view in FIG. 3B. Although only a single directive optical device 300 is shown in FIGS. 3A and 3B, it will be appreciated that multiple directive optical devices may be disposed on the substrate 302. The substrate may be substantially transparent at the operating wavelength. For example, in some embodiments, the substrate may be glass.

The directive optical device 300 may include a transparent anode layer 304 (which may, for example, be like the second electrical contact 106 of the device 100 of FIG. 1). Embedded within the anode layer may be a partially reflective grating 306 (which may, for example, be like the partially reflective grating 108). Above the anode layer may be an optically active layer 308 (which may, for example, be like the optically active material 102, and thus may be any of the examples described above). On the other side of the optically active layer may be a spacer 310, above which may be a reflective cathode layer 312 (which may, for example, be like the first electrical contact 104). The spacer may be a transparent material (e.g., indium-tin-oxide).

The spacer 310 may help to improve the efficiency of the device. For example an optical distance $d_1$ may be provided between the optically active layer 308 (or region of peak emission/collection within the optically active layer) and the reflective cathode 312. By setting the optical distance $d_1$ to approximately an odd multiple of $\lambda/4$, increased efficiency may be obtained. This is because reflections from the reflective cathode may add in phase with electromagnetic radiation within the optically active layer.

Similarly, the optical distance $d_2$ between the optically active layer 308 (or region of peak emission/collection within the optically active layer) and the partially reflective grating 306 may be controlled to affect the directivity and efficiency. For example, by setting the optical distance $d_2$ to about $\lambda/4$ (or an odd multiple of $\lambda/4$) increased input/output efficiency may be obtained.

In some embodiments, the dimensions of the device 300 may be selected so that the optical distance ($d_1+d_2$) between the partially reflective grating 306 and the reflective cathode 312 is equal to $\lambda/2$. The optically active layer 308 (or a portion of the optically active layer) may be positioned between the partially reflective grating and the reflective cathode in a desired optical distance relationship between the two.

It will be appreciated that the device 300 of FIG. 3 is flipped top-to-bottom as compared to the device 100 of FIG. 1. While the device of FIG. 3 may be designed to operate through the substrate (e.g., emitting light in a downward direction or alternatively collecting light coming in an upward direction), the invention is not so limited. In some embodiments, a directive optical device (e.g., the devices of FIG. 1 and FIG. 3) may be constructed on an opaque substrate (e.g., a ceramic material) and may be designed to operate in a direction away from the substrate. In some embodiments, the cathode may be transparent and the anode may be reflective.

Figure 4:
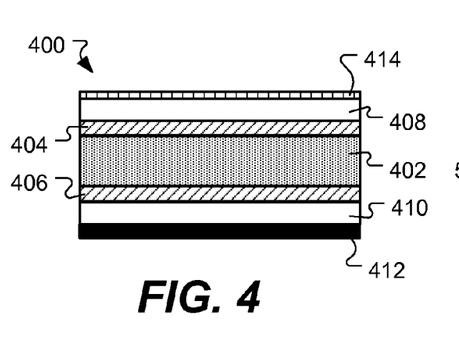
FIG. 4 is a side cross section illustration of another directive optical device in accordance with some embodiments of the present invention.

FIG. 4 illustrates another example of a directive optical device in accordance with some embodiments of the invention. The device may include a optically active material 402 (e.g., similar to the optically active material 102) sandwiched between two electrical contacts 404, 406. The electrical contacts may be an anode and a cathode (e.g., similar to the electrical contacts 104, 106 described above). The electrical contacts may be a substantially transparent electrically conductive material (e.g., conductive oxides, etc.). Disposed adjacent to the electrical contacts may be spacers 408, 410. The spacers may be substantially transparent (e.g., glass, $SiO_2$ layers, indium-tin-oxide, etc.). At one side of the device may be a reflector 412, and at the other side of the device may be a partially reflective grating 414. The electrical contacts may be used to communicate voltage (current) with the optically active material. The spacer 410 may provide the desired spacing between the optically active material and the reflector (e.g., as described above). The spacer 408 may provide the desired spacing between the optically active material and the partially reflective grating (e.g., as described above). Accordingly, operation of the device may be similar to devices 100, 300 as described above. The device may be constructed on a substrate. For example, the substrate may be reflective and may function as the reflector, or may be opaque and positioned proximate to the reflector. As another example, the substrate may be transparent and positioned proximate to the partially reflective grating.

Figure 5:
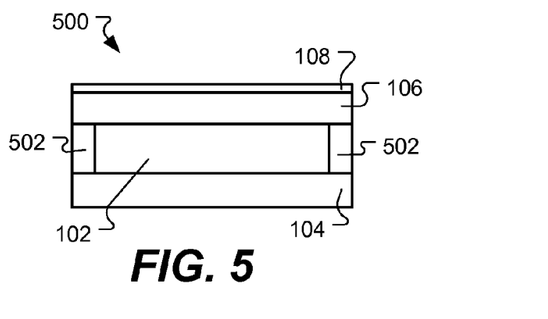
FIG. 5 is a side view illustration of a directive optical device having sidewalls in accordance with some embodiments of the present invention.

FIG. 5 illustrates another embodiment of a directive optical device. The device 500 may be generally similar to the directive optical device of FIG. 1, with the addition of one or more reflective sidewalls 502. In some embodiments, reflective sidewalls may be disposed on two opposite edges of the optically active material 102 (e.g., two parallel edges that are orthogonal to the first side and second side at which the electrical contacts 104, 106 are disposed). Although shown here as extending only between the electrical contacts, the sidewalls are not so limited, and may extend upward through the electrical contacts (and, if desired), through the partially reflective grating.

In some embodiments, reflective sidewalls may be disposed on four opposite edges of the optically active material. The sidewalls may be reflective at the wavelength the optical device operates at. The sidewalls may be spaced from each other by a desired distance. The sidewalls may provide lateral containment of the electromagnetic radiation and encourage resonance within the device 500. In some embodiments, the lateral containment may occur along dimensions where the grating pitch does not laterally inhibit propagation. In some embodiments, the reflective grating may be a sub-half wavelength grating and the sidewalls may be separated by less than a wavelength. In some embodiments, the sidewalls may be separated by about half a wavelength, which may provide aperture efficiency greater than 0.85.

Figure 6:
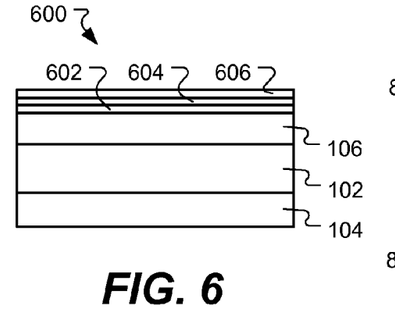
FIG. 6 is a side view illustration of a directive optical device having multiple partially reflective gratings in accordance with some embodiments of the present invention.

FIG. 6 illustrates another embodiment of a directive optical device. The device 600 may be generally similar to the directive optical device of FIG. 1, with the inclusion of additional partially reflective gratings. For example, two or more partially reflective gratings 602, 604, 606 may be included (although three are shown, the invention is not so limited). Although the gratings are shown disposed above the electrical contact 106, in some embodiments, one or more of the gratings can be disposed within the electrical contact similarly to the device of FIG. 3. Furthermore, in some embodiments, spacers (not shown) can be included between the gratings similarly to the spacer 408 of FIG. 4. The partially reflective gratings can be like any of the partially reflective gratings 108, 200, 312, 414 described above. To support resonance, in some embodiments, the partially reflective gratings may be separated from each other by an appropriate spacing such as a multiple of one half of a wavelength. The inclusion of additional partially reflective gratings may increase the directivity of the optical device and may also tend to narrow the bandwidth of resonance. To broaden the bandwidth of resonance, in some embodiments, the spacing between the reflective gratings may be adjusted or perturbed relative to a regular one half wavelength spacing.

Figure 7:
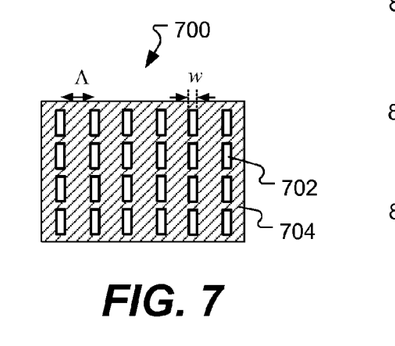
FIG. 7 is a top view illustration of another partially reflective grating which may be used in place of the partially reflective grating of FIG. 2 in accordance with some embodiments of the present invention

FIG. 7 illustrates an alternate form of a partially reflective grating 700 in the form of an aperture grating which may be used in place of the patch grating 200 shown in FIG. 2. The aperture grating 700 may comprise a plurality of optically non-reflective apertures 702 disposed within an optically reflective conductive material 704. The apertures may be dimensioned similarly to the patches 202 described above in FIG. 2. In some embodiments, aperture grating 700 may be used as any of partially reflective gratings 108, 312, 414, 602, 604, and 606.

In some embodiments, a second grating may be used as a reflector. For example, by suitable pitch and sizing of the patches (or apertures), the second grating may be made substantially reflective at the wavelength. Accordingly, a directive optical device may include an optically active material disposed between a first partially reflective grating and a second substantially reflective grating, wherein the first partially reflective grating inhibits lateral propagation.

In some embodiments, a directive optical device may include a means for converting between electromagnetic radiation and an electrical voltage. For example, the means for converting may be like the optically active material 102 described above. The means for converting may comprise a means for emitting electromagnetic radiation in response to an applied voltage (e.g., a light emitting material as described above). Alternatively, the means for converting may comprise a means for generating a voltage in response to electromagnetic radiation (e.g., a light collecting material as described above). The electromagnetic radiation may be light (e.g., having a wavelength in the ultraviolet, visible, or infrared band). The means for converting may include electrical contacts used to accept or provide a voltage (e.g., like any of electrical contacts 104, 106, 304, 310, 404, 406).

The device may also include a means for reflecting the electromagnetic radiation. The means for reflecting may be disposed proximate to a first side of the means for converting. In some embodiments, the means for reflecting may be an electrical contact (e.g., like electrical contact 104). In some embodiments, the means for reflecting may be a substrate on which the device is constructed (e.g., like substrate 412). In some embodiments, the means for reflecting may be a partially reflective grating (e.g., as described above).

The device may also include a means for inhibiting lateral propagation and partially reflecting the electromagnetic emission. The means for inhibiting may be disposed proximate to a second side of the means for converting. In some embodiments, the means for inhibiting may be a partially reflective grating (e.g., like any of partially reflective grating 108, 200, 306, 414, 602, 604, 606, 700). The means for inhibiting may form an asymmetric Fabry-Perot resonator in which the means for converting is disposed. The means for inhibiting may attenuate waveguide modes within the means for converting.

The means for reflecting and the means for inhibiting may be spaced apart from each other by an optical distance of about a half wavelength. The means for converting may be disposed between the means for reflecting and the means for inhibiting. The means for converting may be positioned so that peak emission/collection area within the means for converting is about a quarter wavelength away from the means for reflecting, a quarter wavelength away from the means for inhibiting, or a quarter wavelength away from both.

Figure 8:
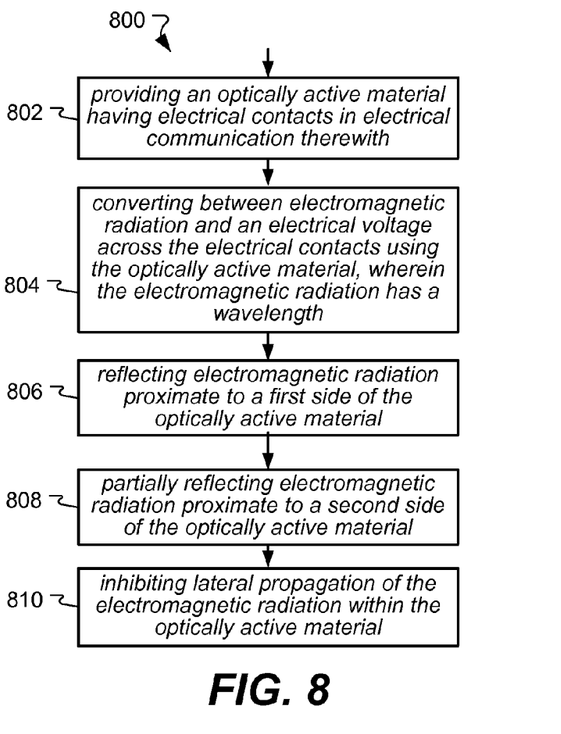
FIG. 8 is a flow chart of a method for operating a directive optical device in accordance with some embodiments of the present invention.

FIG. 8 illustrates a flow chart of a method for operating a directive optical device in accordance with some embodiments of the invention. The method, shown generally at 800, may include providing 802 an optically active material having electrical contacts in electrical communication therewith. For example, the optically active material may be any of the examples described above, and the electrical contacts may be any of the examples described above.

The method may also include converting 804 between electromagnetic radiation and an electrical voltage across the electrical contacts using the optically active material. The optically active material may emit electromagnetic radiation (e.g., when a voltage is applied to the electrical contacts) or the optically active material may collect electromagnetic radiation (e.g., generating a voltage across the electrical contacts). The electromagnetic radiation may include one or more wavelengths, for example, as described above.

Another operation in the method may be reflecting 806 electromagnetic radiation proximate to a first side of the optically active material. For example, as described above, one of the electrical contacts may be reflective. As another example, as described above, a reflective material may be provided which is spaced away from the optically active material. For example, the spacing may be an optical distance substantially equal to an odd integer multiple of a quarter wavelength of the electromagnetic radiation.

Additional operations in the method 800 may be partially reflecting 808 electromagnetic radiation proximate to a second side of the optically active material and inhibiting 810 lateral propagation of the electromagnetic radiation within the optically active material. For example, as described above, a partially reflective grating may be used to partially reflect electromagnetic radiation and inhibit lateral propagation within the optically active material. In some embodiments, the partially reflective grating may be embedded within an electrical contact. In some embodiments, the partially reflective grating may be spaced away from the optically active material. For example, the spacing may be at an optical distance substantially equal to a quarter wavelength. In some embodiments, the partially reflective grating may be spaced away from a reflective electrical contact by an optical distance substantially equal to a half wavelength.

FDTD simulations of structures like those disclosed above indicate potential efficiency improvements in output power emission of greater than 50% may be obtained over structures that omit the partially reflective grating and reflective layer. The following figures illustrate simulation results showing predicted device performance as a function of various parameters for an emissive device. Similar performance for collective devices are expected.

Figure 9:
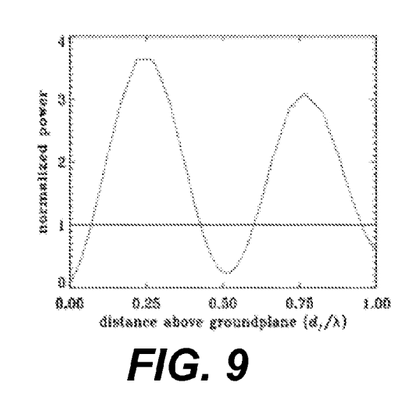
FIG. 9 is a plot showing total output power as a function of separation distance between an optically active material and a reflective layer in accordance with some embodiments of the present invention.
Figure 10:
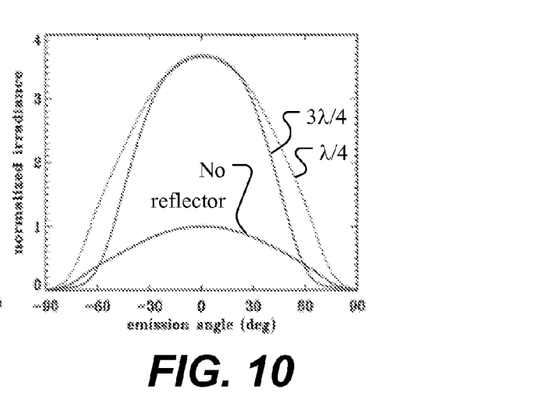
FIG. 10 is a plot showing output irradiance versus emission angle as a function of separation distance between an optically active material and a reflective layer in accordance with some embodiments of the present invention.

FIG. 9 shows the normalized power output as a function of the spacing between the optically active material (simulated as a dipole emitter) and the reflective layer. The power is shown in relation to that of a free space emitter (the horizontal line at normalized power equal to 1). It can be seen that the peak power occurs for a separation distance of one quarter wavelength, although a lesser peak occurs at a separation of three quarter wavelengths (and is expected to repeat at odd multiples of the quarter wavelength). FIG. 10 shows the resulting normalized irradiance as a function of angle for three cases corresponding to a free-space emitter (no reflective layer), separation of one-quarter (between the emitter and the reflective layer) and separation of three-quarter wavelengths. It can be seen that, in addition to increased emission, tighter angular control of the emission may also be obtained.

Figure 11:
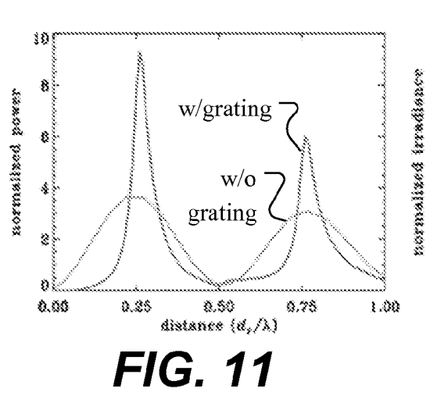
FIG. 11 is a plot showing total output power as a function of separation distances between an optically active material and a partially reflective grating and a reflective layer in accordance with some embodiments of the present invention.
Figure 12:
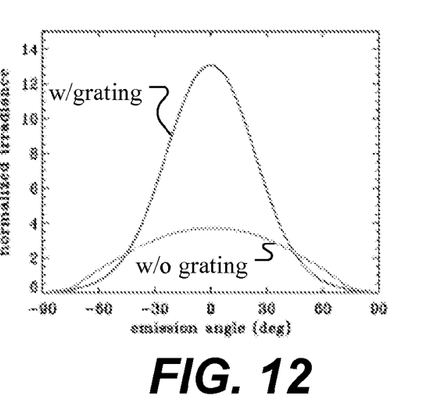
FIG. 12 is a plot showing output irradiance versus emission angle as a function of separation distances between an optically active material and partially reflective grating and a reflective layer in accordance with some embodiments of the present invention.

FIGS. 11 and 12 compare the performance when the partially reflective grating is added. The dimensions are controlled so that $d_2=d_1$ (i.e. the dipole emitter is centered between the reflector and partially reflective grating). It can be seen that a sharp peak in the emission may be obtained when the spacings are off multiples of about one quarter wavelength.

Figure 13:
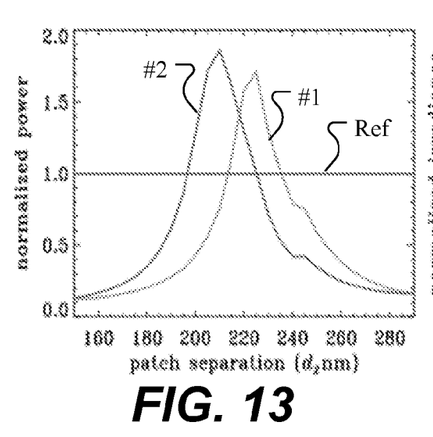
FIG. 13 is a plot showing total output power as a function of separation distance between an optically active material and a partially reflective grating in accordance with some embodiments of the present invention.
Figure 14:
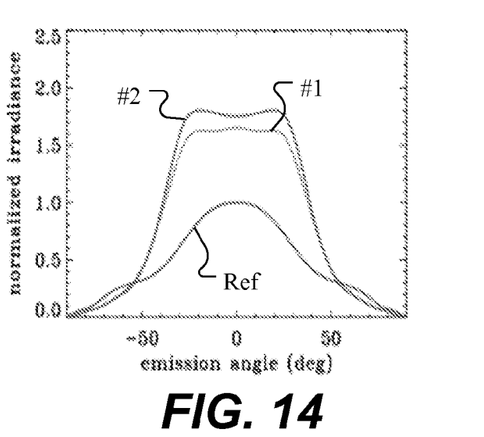
FIG. 14 is a plot showing output irradiance versus emission angle as a function of separation distance between an optically active material and a partially reflective grating in accordance with some embodiments of the present invention.

FIGS. 13 and 14 help to illustrate the effect that the spacing of the partially reflective grating has on output emission. Two different structures are shown, both operating at 500 nm. The first structure (#1) has no spacer between the optically active material and the reflector, and the second structure (#2) has a 20 nm spacer. For reference, a device (Ref) without the partially reflective grating is also shown. Irradiation has been normalized to the irradiance at the peak emission angle of the reference structure. It can be seen that the partially reflective grating may result in a surprisingly large and substantially constant emission within an angular range and may result in a significant increase in output emission.

Figure 15:
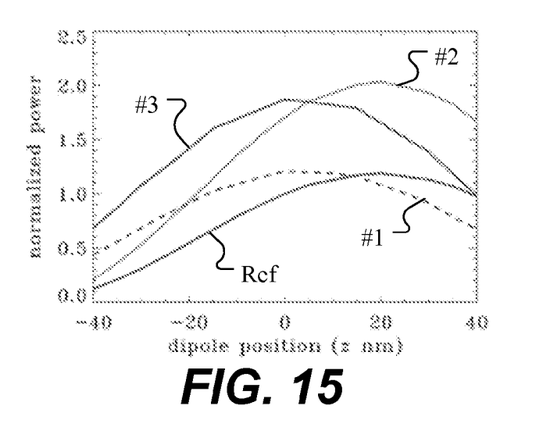
FIG. 15 is a plot showing output power as a function of emission location within various light emitting devices in accordance with some embodiments of the present invention.

In some embodiments, the emission from the optically active material may occur over a large portion (or entirely throughout) the optically active material. In such an example, some emission may occur closer to the reflector (e.g., less than one-quarter wavelength away) and thus further from the partially reflective grating (e.g., more than one-quarter wavelength away) and vice versa. Thus, efficiency may be affected by the vertical position of emission within the emission layer. In particular, spacing of the reflector and partially reflective grating may be relative to a peak emission area (or other desired position) within the emission layer. FIG. 15 illustrates the effects of emission position (dipole position) within the optically active material (referenced to z=0=center of the optically active layer). Four cases are shown: "Ref" corresponds to the structure without the partially reflective grating, "#1" is a device with just the reflector (no partially reflective grating), "#2" is a device with the reflector and a spaced away partially reflective grating, and "#3" is a device with a spaced away reflector and spaced away partially reflective grating. It can be seen that the inclusion of the spacer between the reflector and the optically active material may help to shift the emission curve so that the peak emission area within the optically active layer is optimally positioned relative to the reflector and partially reflective grating. When averaged over all possible emission positions within the optically active layer, the resulting output power may be increased for device #2 by nearly 71% over the reference. Inclusion of the spaced away reflector may provide an additional improvement, and may result in output power increase of 76% over the reference.

While various examples have been illustrated and described, it is to be understood that the invention is not limited to the above example. In particular, features shown in one embodiment may be included in other embodiments. Furthermore, some embodiments may also include features illustrated in other embodiments. Many other applications of the presently disclosed techniques may prove useful. Accordingly, the above-referenced arrangements are illustrative of some applications for the principles of the present invention. It will be apparent to those of ordinary skill in the art that numerous modifications may be made without departing from the principles and concepts of the invention as set forth herein.

The invention claimed is:

1. A directive optical device, comprising:
an optically active material having a first side and a second side and being capable of converting between an electrical voltage and light at a wavelength;
a first electrical contact in electrical communication with the optically active material proximate to the first side, the first electrical contact being reflective at the wavelength;
a second electrical contact in electrical communication with the optically active material proximate to the second side, wherein the second electrical contact is transparent at the wavelength;
a partially reflective grating disposed proximate to the second electrical contact, wherein the partially reflective grating comprises a periodic array of alternating optically reflective and non-reflective regions, wherein the partially reflective grating includes a plurality of non-conductive apertures within a conductive sheet; and
a spacer disposed between, and in electrical communication with, the optically active material and the partially reflective grating, the spacer comprising a material that is transparent to the wavelength,
wherein the first electrical contact is positioned on the first side of the optically active material and the second electrical contact is positioned on the second side of the optically active material, and
wherein the partially reflective grating is spaced away from the optically active material by an optical distance of substantially an odd multiple of one quarter of the wavelength.

2. The device as in claim 1, wherein the optically reflective regions are spaced from each other by an optical distance of substantially one half of the wavelength.

3. The device as in claim 1, wherein the optically reflective regions each have a width of substantially one third of the wavelength.

4. The device as in claim 1, wherein the optically non-reflective regions are spaced from each other by an optical distance of substantially one half of the wavelength.

5. The device as in claim 1, wherein the optically non-reflective regions each have a width of substantially one third of the wavelength.

6. The device as in claim 1, wherein the partially reflective grating is spaced away from the first electrical contact by an optical distance of substantially one half of the wavelength.

7. The device as in claim 1, wherein the partially reflective grating is spaced away from the optically active material by an optical distance of substantially one quarter of the wavelength.

8. The device as in claim 1, wherein the optically active material is spaced away from each of the first electrical contact and the partially reflective grating by an optical distance of substantially one quarter of the wavelength.

9. The device as in claim 1, wherein optically active material is spaced away from the first electrical contact.

10. The device as in claim 9, wherein the optically active material is spaced away from the first electrical contact by an optical distance of substantially one quarter of the wavelength.

11. The device as in claim 1, further comprising a substrate, wherein the partially reflective grating is disposed proximate to the substrate and the substrate is substantially transparent at the wavelength.

12. The device as in claim 1, further comprising a sidewall disposed proximate the optically active material and disposed between the first electrical contact and partially reflective grating, wherein the sidewall is reflective at the wavelength.

13. The device as in claim 1, wherein the optically active material is a light emitting material that converts an electrical voltage applied between the first electrical contact and the second electrical contact into emitted electromagnetic energy.

14. The device as in any of claim 13, wherein the light emitting material comprises any of: an electroluminescent material, a light emitting diode, an organic light emitting diode, a lasing material, a filament, and a thermal emitter.

15. The device as in claim 1, wherein the optically active material is a light collecting material that converts received electromagnetic energy into an electrical voltage between the first electrical contact and the second electrical contact.

16. The device as in claim 15, wherein the light emitting material comprises any of: a photoactive layer, a sensor, a photovoltaic device, a thermoelectric device, and a thermal target.

17. The device as in claim 1, wherein the wavelength is within any of the ultraviolet band, the visible band, and the infrared band.

18. A directive optical device, comprising:
a first electrical contact, the first electrical contact being reflective at a wavelength;
a second electrical contact, the second electrical contact being transparent at the wavelength;
an optically active material having a first side and a second side and being capable of converting between an electrical voltage and light at the wavelength;
a spacer disposed between, and in electrical communication with, the optically active material proximate to the first side and the first electrical contact, the spacer comprising a material that is transparent at the wavelength; and
a partial reflector disposed proximate to the second side of the optically active material, wherein the partial reflector includes a plurality of non-conductive apertures within a conductive sheet,
wherein the first electrical contact is positioned on the first side of the optically active material and the second electrical contact is positioned on the second side of the optically active material, and
wherein the first electrical contact is spaced away from the optically active material by an optical distance of substantially an odd multiple of one quarter of the wavelength.

19. The device as in claim 18, wherein the partial reflector is spaced away from the optically active material by an optical distance of substantially a multiple of one quarter of the wavelength.

20. The device as in claim 18, wherein the optical distance is one quarter of the wavelength.

21. The device as in claim 18, wherein the optical distance is three quarters of the wavelength.

22. A directive optical device, comprising:
an optically active material having a first side and a second side and being capable of converting between an electrical voltage and light at a wavelength;
a first electrical contact in electrical communication with the optically active material proximate to the first side, the first electrical contact being reflective at the wavelength;
a second electrical contact in electrical communication with the optically active material proximate to the second side, wherein the second electrical contact is transparent at the wavelength;
a substantially reflective grating having patches or apertures and being disposed proximate to the first electrical contact; and
a partially reflective grating disposed proximate to the second electrical contact, wherein the partially reflective grating includes a periodic array of alternating optically reflective regions and optically transparent regions, wherein the optically reflective regions and the optically transparent regions alternate in a first direction and a second direction, wherein the optically reflective regions are reflective at the wavelength, wherein the optically transparent regions are transparent at the wavelength, and
wherein the optically active material is spaced away from the first electrical contact by an optical distance of substantially an odd multiple of one quarter of the wavelength.

23. The device as in claim 22, wherein the optically reflective regions are spaced from each other by an optical distance of substantially one half of the wavelength.

24. The device as in claim 22, wherein the optically reflective regions each have a width of substantially one third of the wavelength.

25. The device as in claim 22, wherein the optically transparent regions are spaced from each other by an optical distance of substantially one half of the wavelength.

26. The device as in claim 22, wherein the optically transparent regions each have a width of substantially one third of the wavelength.

27. The device as in claim 22, wherein the partially reflective grating is spaced away from the first electrical contact by an optical distance of substantially one half of the wavelength.

28. The device as in claim 22, wherein the partially reflective grating is spaced away from the optically active material by an optical distance of substantially one quarter of the wavelength.

29. The device as in claim 22, wherein the optically active material is spaced away from each of the first electrical contact and the partially reflective grating by an optical distance of substantially one quarter of the wavelength.

30. The device as in claim 22, further comprising a substrate, wherein the partially reflective grating is disposed proximate to the substrate and the substrate is substantially transparent at the wavelength.

31. The device as in claim 22, wherein the optically active material is a light emitting material that converts an electrical voltage applied between the first electrical contact and the second electrical contact into emitted electromagnetic energy.

\* \* \* \* \*